US006666695B1

(12) United States Patent
Yeh

(10) Patent No.: US 6,666,695 B1
(45) Date of Patent: Dec. 23, 2003

(54) ELECTRONIC CARD CONNECTOR HAVING POWER CONTACTS

(75) Inventor: Joel J. Yeh, Cypress, CA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/241,954

(22) Filed: Sep. 11, 2002

(51) Int. Cl.[7] .......................... H05K 1/00; H01R 13/60

(52) U.S. Cl. ...................................... 439/79; 439/541.5

(58) Field of Search ............................ 439/76.1, 541.5, 439/79; 361/737

(56) References Cited

U.S. PATENT DOCUMENTS 6,183,307 B1 * 2/2001 Laity et al. ................. 439/676
6,238,241 B1 * 5/2001 Zhu et al. ................ 439/541.5
6,290,514 B1 9/2001 McHugh et al.
6,299,455 B1 * 10/2001 Dong .......................... 439/59
6,305,946 B1 10/2001 McHugh et al.

* cited by examiner

*Primary Examiner*—Hung V. Ngo
(74) *Attorney, Agent, or Firm*—Wei Te Chung

(57) ABSTRACT

An electronic card connector (1) for engaging with a circuit card (6) includes an insulating housing (2) having a head section (20) and a pair of guiding arms (22) extending rearwardly from opposite ends of the head section, and a number of signal contacts (3) and power contacts (4) retained in the head section. The head section is step-shaped having a body (202) and a projection (204) located above the body. The projection has a rear face (2042) extending rearwardly beyond a rear face (2022) of the body. The signal and power contacts are respectively retained in the body and the projection of the head section for electrically connecting to the circuit card.

15 Claims, 6 Drawing Sheets

ELECTRONIC CARD CONNECTOR HAVING POWER CONTACTS

BACKGROUND OF THE INVENTION

1. Field of the Invention

The present invention relates to an electronic card connector, and particularly to an electronic card connector having signal contacts and power contacts for respectively transmitting signal and power.

2. Description of Related Art

Electronic card connectors are widely used in electronic products, such as personal computers, for electrically connecting with inserted electronic cards which function as removable mass storage devices. A conventional electronic card connector generally comprises a pair of parallel guiding arms, a head portion located between the guiding arms, and a plurality of signal contacts retained in the head portion for electrically connecting with an inserted electronic card and a mother board on which the electronic card connector is seated. However, the conventional electronic card connectors cannot be used in certain applications requiring power transmission, such as multimedia and high-speed networking. Furthermore, there is a difficulty in reasonably arranging additional power contacts to the conventional electronic card connector for carrying power.

Hence, the present invention aims to provide an electronic card connector having power contacts for carrying power.

SUMMARY OF THE INVENTION

It is an object of the present invention to provide an electronic card connector having signal contacts and power contacts for transmitting signal and power, respectively.

In order to achieve the object set forth, an electronic card connector in accordance with the present invention comprises an insulating housing including a head section and a pair of guiding arms extending rearwardly from opposite ends of the head section, and a plurality of signal and power contacts retained in the head section. The head section is step-shaped having a body and a projection located above the body. The projection has a rear face extending rearwardly beyond a rear face of the body. The signal and power contacts are respectively retained in the body and the projection of the head section for electrically connecting to the inserted circuit card.

Other objects, advantages and novel features of the invention will become more apparent from the following detailed description when taken in conjunction with the accompanying drawings.

DETAILED DESCRIPTION OF THE INVENTION

Figure 1:
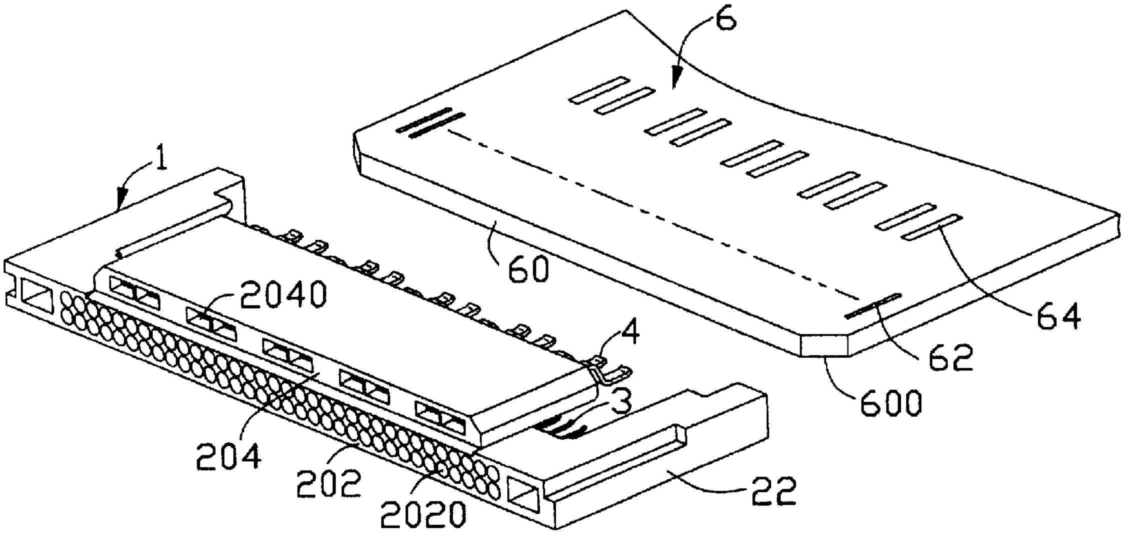
FIG. 1 is a top assembled perspective view of an electronic card connector having power contacts in accordance with the present invention and a circuit card to be inserted into the electronic card connector.
Figure 2:
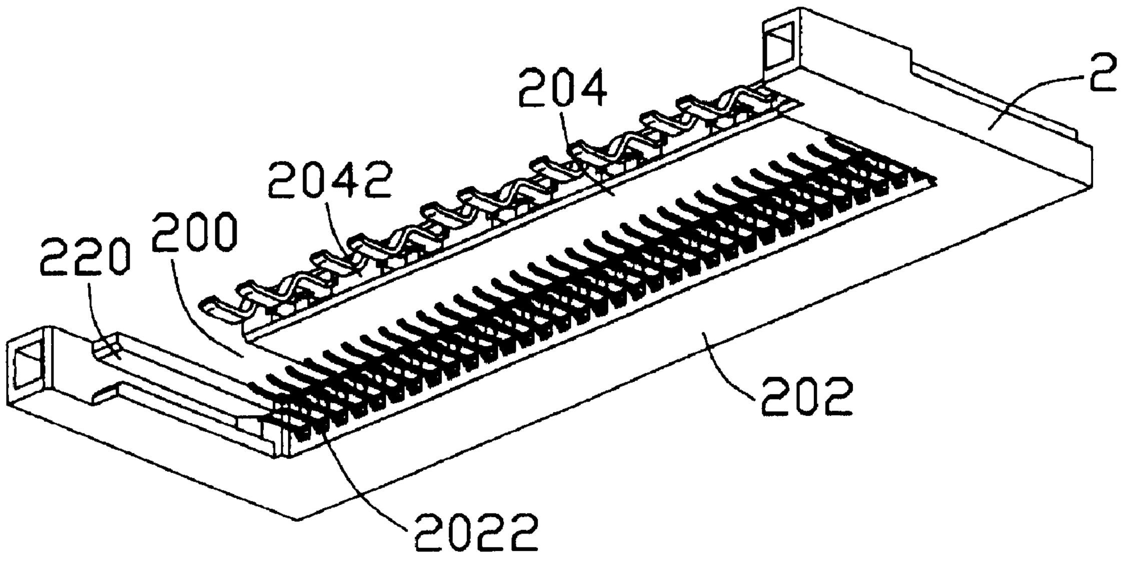
FIG. 2 is a bottom assembled perspective view of the electronic card connector of FIG. 1.

Referring to FIGS. 1 and 2, an electronic card connector 1 in accordance with the present invention and a circuit card 6 to be inserted into the electronic card connector 1 are shown. The circuit card 6 has signal solder pads 62 on upper and lower sides thereof adjacent to a front edge 60 thereof and power solder pads 64 on the upper side thereof.

Figure 3:
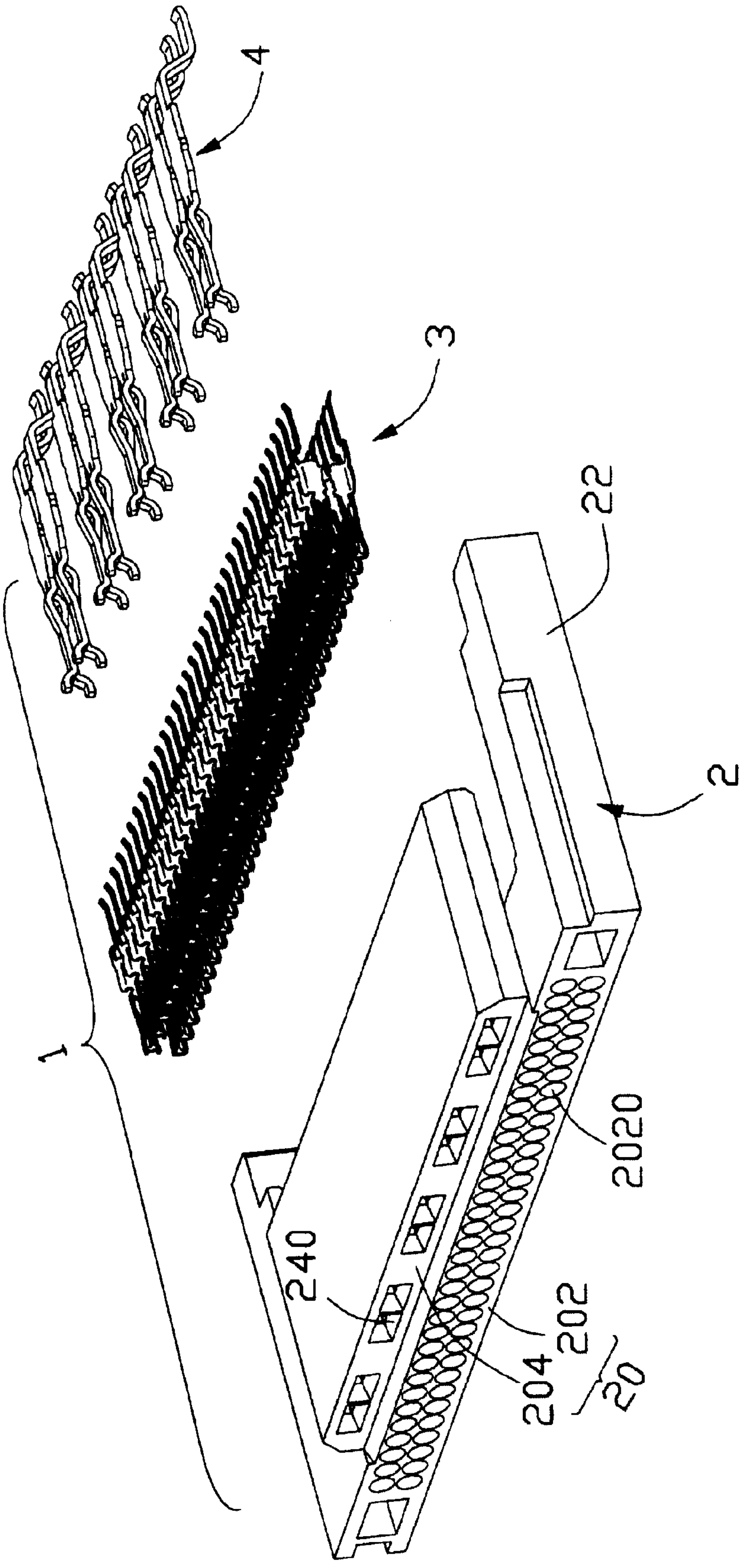
FIG. 3 is an exploded perspective view of the electronic card connector of FIG. 1.

Referring to FIG. 3 in conjunction with FIGS. 1 and 2, the electronic card connector 1 comprises an insulating housing 2 and a plurality of signal contacts 3 and power contacts 4 retained in the insulating housing 2 respectively for signal and power transmission. The insulating housing 2 includes a step-shaped head section 20 and a pair of guiding arms 22 extending rearwardly from opposite ends of the head section 20 to define a card-receiving space 200 therebetween for receiving the circuit card 6. The guiding arms 22 define a pair of opposite guiding channels 220 for guiding the insertion of the circuit card 6. The head section 20 has an elongated body 202 with two rows of passageways 2020 extending therethrough in a back-to-front direction, and a projection 204 located above the body 202 with a row of cavities 2040 extending therethrough in the back-to-front direction. The projection 204 has a rear face 2042 extending rearwardly beyond a rear face 2022 of the body 202.

Figure 3A:
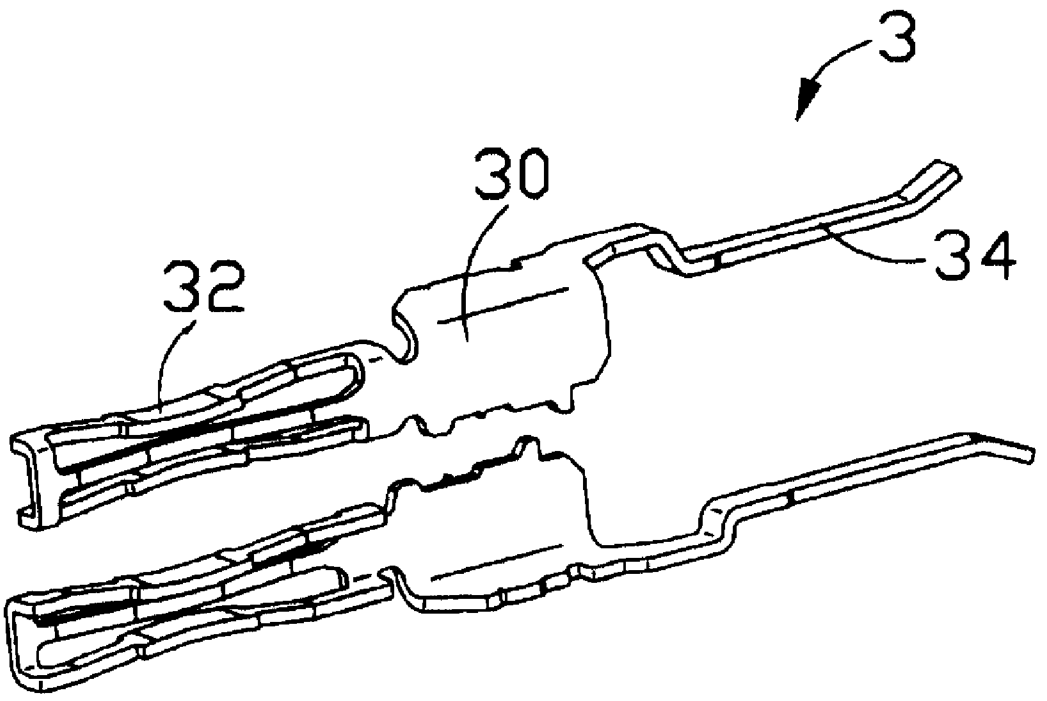
FIG. 3*a* is an enlarged perspective view of a pair of vertically aligned signal contacts of FIG. 3.

The signal and power contacts 3, 4 are respectively formed from a metal sheet. The signal and power contacts 3, 4 are respectively inserted into the passageways 2020 and the cavities 2040 of the head section 20 in the back-to-front direction. Referring to FIG. 3*a*, each pair of vertically aligned signal contacts 3 are arranged in a mirror-image relationship. Each signal contact 3 includes a retention portion 30 for being fixedly retained in the body 202, a socket-shaped mating portion 32 extending forwardly from the retention portion 30 for engaging with a complementary connector (not shown), and a rear tail portion 34 extending rearwardly from the retention portion 30 into the card-receiving space 200 for electrically connecting with the circuit card 6 using a Surface Mount Technology (SMT). The tail portions 34 of the signal contacts 3 are arranged in upper and lower rows and spaced a distance in a vertical direction substantially the same as a thickness of the circuit card 6 for straddling on opposite surfaces of the circuit card 6.

Figure 3B:
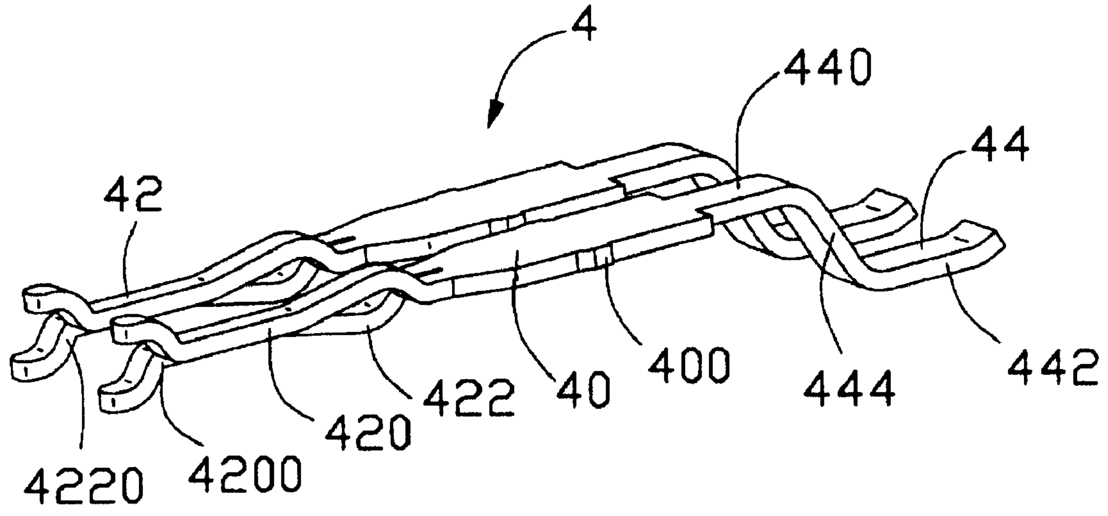
FIG. 3*b* is an enlarged perspective view of a pair of differential power contacts of FIG. 3.

Referring to FIG. 3*b*, each power contact 4 includes a planar retention portion 40 with barbs 400 on opposite side edges for interferential engagement with the projection 204 in a corresponding cavity 2040, a front mating portion 42 extending forwardly from the retention portion 40 for engaging with the complementary connector, and a rear tail portion 44 extending rearwardly from the retention portion 40 into the card-receiving space 200 for electrically connecting with the circuit card 6 also using the Surface Mount Technology. The front mating portion 42 of the each power contact 4 has a pair of laterally offset, vertically opposing cantilevered spring arms 420, 422 extending from opposed sides of the retention portion 40. The spring arms 420, 422 are formed so that they extend first away from each other adjacent the retention portion 40 and thereafter toward each other. The spring arms 420, 422 have a pair of opposite curved contact portions 4200, 4220 at free ends thereof for contacting with a corresponding terminal of the complementary connector. Each rear tail portion 44 of the power contact 4 is Z-shaped having an extending portion 440 extending rearwardly from the retention portion 42, a solder portion 442 located at a lower position for being soldered to a corresponding power solder pad 64 on the circuit card 6, and an intermediate portion 444 interconnecting the extending portion 440 and the solder portion 442.

Figure 4:
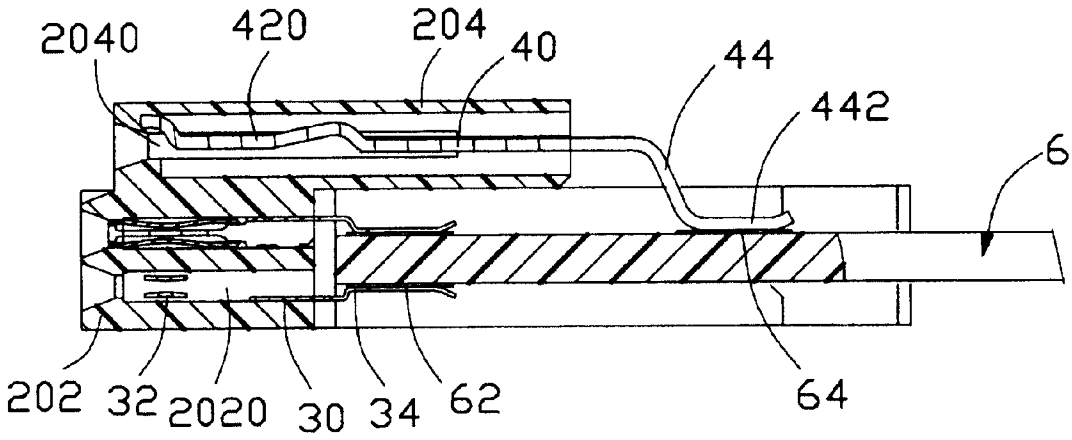
FIG. 4 is a cross-sectional view of the electronic card connector, showing the circuit card electrically engaging with the signal and power contacts of the electronic card connector.

The circuit card 6 is inserted into the card-receiving space 200 of the insulating housing 2 in the back-to-front direction. The circuit card 6 has a pair of chamfers 600 at the front edge 60 for ensuing a correct insertion thereof. Referring to FIG. 4, after the circuit card 6 arrives at a final position, the tail portions 34 of the signal contacts 3 abut against the signal solder pads 62 on the upper and lower sides of the circuit card 6, and the solder portions 442 of the power contacts 4 abut against the power solder pads 64 on the upper side of the circuit card 6. The tail portions 34 of the signal contacts 3 and the solder portions 442 of the power contacts 4 are mechanically and electrically connected with the circuit card 6 after a reflowing process is employed.

It is noted that the projection 204 has the rear face 2042 extending rearwardly beyond the rear face 2022 of the body 202 for stably keeping the rear tail portions 44 of the power contacts 4 in a common plane, thereby ensuring a reliable connection between the power contacts 4 and the circuit card 6 after the reflowing process is employed. In the preferred embodiment of the present invention, adjacent differential pairs of the power contacts 4 are spaced a distance larger than a pitch between the power contacts 4 of each differential pair.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electronic cad connector comprising:

an insulating housing including a head section and a pair of guiding arms extending rearwardly from opposite ends of the head section, the head section having a body and a projection located above the body, the projection having a rear face extending rearwardly beyond a rear face of the body;

a plurality of signal contacts retained in the body of the head section for electrically connecting to an inserted circuit card; and a row of power contacts retained in the projection of the head section for electrically connecting to the inserted circuit card.

2. The electronic card connector as claimed in claim 1, wherein the signal contacts have tail portions disposed between planes defined by the rear faces of the projection and the body.

3. The electronic card connector as claimed in claim 2, wherein the power contacts have tail portions extending rearwardly beyond the rear face of the projection for soldering to the inserted circuit card.

4. The electronic card connector as claimed in claim 3, wherein the tail portions of the signal contacts are arranged in upper and lower rows for electrically straddling on opposite surfaces of the inserted circuit card using a surface mount technology.

5. The electronic card connector as claimed in claim 4, wherein the tail portions of the power contacts have solder portions in alignment with the upper row of the tail portions of the signal contacts for soldering to the circuit card.

6. The electronic card connector as claimed in claim 1, wherein each power contact includes a retention portion fixedly retained in the projection, a mating portion extending forwardly from the retention portion for engaging with a complementary connector, and a tail portion downwardly and rearwardly extending from the retention portion for soldering to the inserted circuit card.

7. The electronic card connector as claimed in claim 6, wherein the mating portion of the each power contact has a pair of laterally offset, vertically opposing cantilevered spring arms extending from opposed sides of the retention portion.

8. The electronic card connector as claimed in claim 7, wherein the spring arms have a pair of opposite curved contact portions at free ends thereof.

9. An electronic card connector for engaging with an inserted circuit card, comprising:

an insulating housing including a pair of guiding arms and a head section located between the guiding arms, the head section defining therein a plurality of passageways and a row of cavities above the passageways; and a plurality of signal and power contacts respectively received in the passageways and the cavities of the head section, each power contact that has a different structure with each signal contact including a retention portion retained in the head section, a pair of cantilevered spring arms extending from opposed sides of the retention portion in a direction opposite to the extending direction of the guiding arms for mating with a complementary connector, and a tail portion extending from the retention portion in a direction same as the extending direction of the guiding arms for soldering to the inserted circuit card.

10. The electronic card connector as claimed in claim 9, wherein the pair of spring arms of the each power contact is laterally offset and vertically opposed.

11. The electronic card connector as claimed in claim 9, wherein the tail portion of the each power contact extends downwardly and rearwardly from the retention portion and has a solder portion at a lower position thereof for soldering to the inserted circuit card.

12. An electrical connector assembly comprising:

a circuit card having solder pads thereon; and an electrical connector with the circuit card received therein, comprising:

an insulating housing including a head section and a pair of guiding arms extending rearwardly from opposite ends of the head section for guiding the insertion of the circuit card, the head section having a body and a projection located above the body, the projection having a rear face extending rearwardly beyond a rear face of the body; and a plurality of signal and power contacts respectively retained in the body and projection, the signal and power contacts having tail portions electrically engaging with the solder pads of the circuit card.

13. The electrical connector assembly as claimed in claim 12, wherein the tail portions of the signal contacts are disposed between planes defined by the rear faces of the projection and the body.

14. The electrical connector assembly as claimed in claim 13, wherein the tail portions of the signal contacts are arranged in upper and lower rows and straddle on opposite surfaces of the circuit card.

15. An electrical connector assembly comprising:

a unitary insulative housing defining stacked first and second sections extending along a longitudinal direction thereof, said first section being longer than the second section in the longitudinal direction while shorter in a front-to-back direction perpendicular to said longitudinal direction;

two rows of signal contacts disposed in the first section;

one row of power contacts disposed in the second section and having a smaller amount than the signal contacts;

a printed circuit board defining two opposite surfaces thereon and sandwiched between tails of said two rows of signal contacts; and tails of the power contacts being longer than and extending, along the front-to-back direction, over those of the signal contacts, and engaging one of said two opposite surfaces closer to the power contacts than the other.

* * * * *